(12) United States Patent
Kurihara et al.

(10) Patent No.: US 9,236,413 B2
(45) Date of Patent: Jan. 12, 2016

(54) MANUFACTURING METHOD OF SOLID-STATE IMAGING APPARATUS

(71) Applicant: CANON KABUSHIKI KAISHA, Tokyo (JP)

(72) Inventors: Masaki Kurihara, Koza-gun (JP); Daisuke Shimoyama, Aiko-gun (JP); Masataka Ito, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 31 days.

(21) Appl. No.: 14/148,063

(22) Filed: Jan. 6, 2014

(65) Prior Publication Data

US 2014/0199801 A1 Jul. 17, 2014

(30) Foreign Application Priority Data

Jan. 16, 2013 (JP) .................. 2013-005613

(51) Int. Cl.
*H01L 21/00* (2006.01)
*H01L 27/146* (2006.01)

(52) U.S. Cl.
CPC .... *H01L 27/14685* (2013.01); *H01L 27/14621* (2013.01); *H01L 27/14627* (2013.01)

(58) Field of Classification Search
CPC .................. H01L 27/14625; H01L 27/14627
USPC .......................................................... 438/70
See application file for complete search history.

(56) References Cited

U.S. PATENT DOCUMENTS

2005/0274968 A1* 12/2005 Kuo et al. ........................ 257/98
2009/0303359 A1* 12/2009 Otsuka et al. ................. 348/280

FOREIGN PATENT DOCUMENTS

JP 2009-088415 A 4/2009

OTHER PUBLICATIONS

Kurihara et al., U.S. Appl. No. 14/148,077, filed Jan. 6, 2014.
Kurihara et al., U.S. Appl. No. 14/147,279, filed Jan. 3, 2014.

* cited by examiner

*Primary Examiner* — Mary Wilczewski
*Assistant Examiner* — Erik T Peterson
(74) *Attorney, Agent, or Firm* — Fitzpatrick, Cella, Harper & Scinto

(57) ABSTRACT

A color filter 5 is formed above a semiconductor substrate SB, in an area above a predetermined light receiving portion among a plurality of light receiving portions 1. A sacrificial layer 8 is formed on upper and side of the first color filter 5. Color filters 6 and 7 are formed above the semiconductor substrate SB, in areas above other light receiving portions adjacent to the predetermined light receiving portion, to expose at least part of the upper surface area of the first color filter 5 on the sacrificial layer 8. The sacrificial layer 8 is etched to remove the upper and side areas of the color filter 5 on the sacrificial layer 8 to form hollow portions 9 between the color filter 5 and the color filter 6 and between the color filter 5 and the color filter 7.

9 Claims, 7 Drawing Sheets

MANUFACTURING METHOD OF SOLID-STATE IMAGING APPARATUS

BACKGROUND OF THE INVENTION

1. Field of the Invention

The present invention relates to a manufacturing method of a solid-state imaging apparatus (solid-state imaging device) such as a CCD sensor and a CMOS sensor.

2. Description of the Related Art

A technique for improving the light collecting efficiency of receiving portions, particularly, a technique of more efficiently collecting light with a steep incident angle, is desired in a solid-state imaging apparatus. For example, a solid-state imaging apparatus is proposed in recent years, wherein hollow portions are formed in boundary areas of color filters formed above light receiving portions, and reflection of hollow portion interfaces is used to improve the light collecting efficiency of the light receiving portions (for example, see Japanese Patent Application Laid-Open No. 2009-088415).

A formation method of the hollow portions illustrated in Japanese Patent Application Laid-Open No. 2009-088415 will be described.

FIGS. 6A to 6D are schematic views illustrating an outline of forming hollow portions in boundary areas of color filters in a manufacturing method of a solid-state imaging apparatus described in Japanese Patent Application Laid-Open No. 2009-088415.

In Japanese Patent Application Laid-Open No. 2009-088415, a first color filter is formed in a predetermined area on a planarized layer as illustrated in FIG. 6A. A thin sacrificial layer is formed on the entire surface including the surface of the first color filter.

As illustrated in FIG. 6B, anisotropic dry etching is used to etch-back the sacrificial layer. The sacrificial layer is left only on the side walls of the first color filter, and the sacrificial layer is removed from the rest of the surface.

As illustrated in FIG. 6C, a second color filter is formed on the planarized layer, adjacent to one of the sides of the first color filter, through the sacrificial layer. A third color film is formed on the planarized layer, adjacent to the other side of the first color filter, through the sacrificial layer.

As illustrated in FIG. 6D, the sacrificial layer is removed by etching, and hollow portions are formed between the color filters.

However, in the method described in Japanese Patent Application Laid-Open No. 2009-088415, when the second and third color filters are formed to cover the upper surfaces of the sacrificial layer formed on the side walls of the first color filter in the step illustrated in FIG. 6C, the sacrificial layer may not be removed by the etching process, and the hollow portions may not be formed.

The present invention has been made in view of the problem, and an object of the present invention is to provide a manufacturing method of a solid-state imaging apparatus that allows more stable formation of hollow portions between color filters.

SUMMARY OF THE INVENTION

According to an aspect of the present invention, manufacturing method of a solid-state imaging apparatus having a semiconductor substrate having a plurality of light receiving portions provided thereon, comprises: forming a predetermined color filer layer at a position corresponding to a predetermined light receiving portion among the plurality of light receiving portions; forming a sacrificial layer at least on an upper surface and an side surface of the predetermined color filer layer; forming the other color filer layer at a position corresponding to the other light receiving portion adjacent to the predetermined light receiving portion among the plurality of light receiving portions, to expose the sacrificial layer at least a part thereof on an area of the upper surface of the predetermined color filer layer; and etching the sacrificial layer under a condition such that the sacrificial layer is exposed at least the part thereof on the area of the upper surface of the predetermined color filer layer, to remove the sacrificial layer on an area of the upper surface and on the side surface of the predetermined color filer layer, and to form a hollow portion between the predetermined color filer layer and the other color filer layer.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 7A:
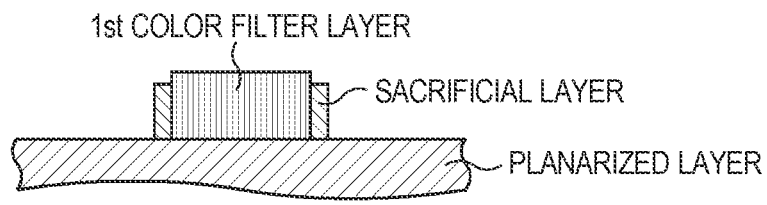
FIGS. 7A and 7B are schematic views illustrating an example when formation of hollow portions is difficult.
Figure 7B:
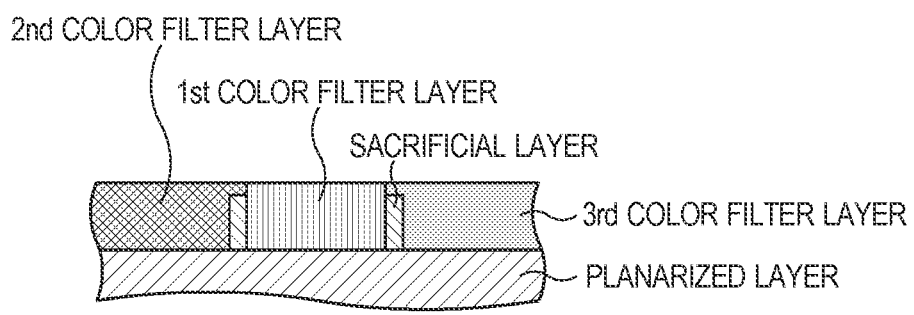
Figure 8:
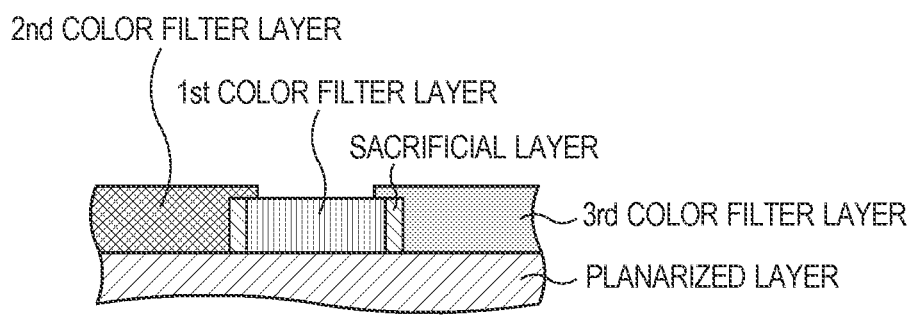
FIG. 8 is a schematic view illustrating an example when formation of hollow portions is difficult.

FIGS. 7A, 7B and 8 are schematic views illustrating examples when formation of hollow portions is difficult in a formation method of hollow portions described in Japanese Patent Application Laid-Open No. 2009-088415.

Figure 6A:
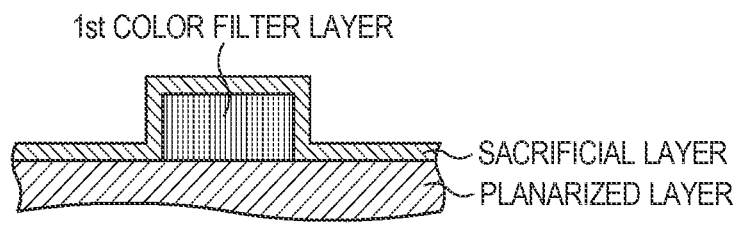
FIGS. 6A, 6B, 6C and 6D are schematic views illustrating an outline of forming hollow portions in boundary areas of color filters in a manufacturing method of a solid-state imaging apparatus described in Japanese Patent Application Laid-Open No. 2009-0088415.
Figure 6B:
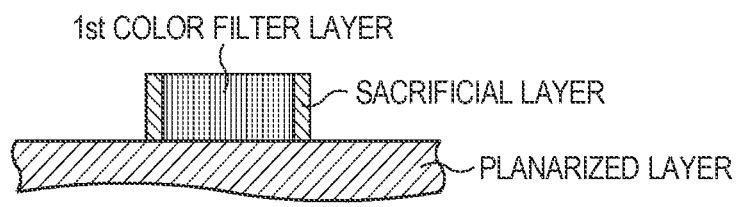

In the example illustrated in FIGS. 7A and 7B, upper surfaces of a sacrificial layer may be lower than an upper surface of a first color filter as illustrated in FIG. 7A, depending on a condition of etching in a step illustrated in FIG. 6B. In this case, when second and third color filters are formed, the second and third color filters may be formed to cover the upper surfaces of the sacrificial layer as illustrated in FIG. 7B. The sacrificial layer may not be exposed by an etching process in such a case. The sacrificial layer may not be removed, and the hollow portions may not be formed.

Figure 6C:
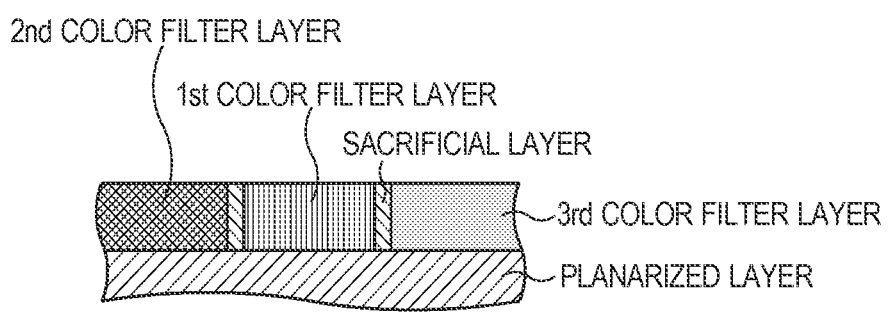
Figure 6D:
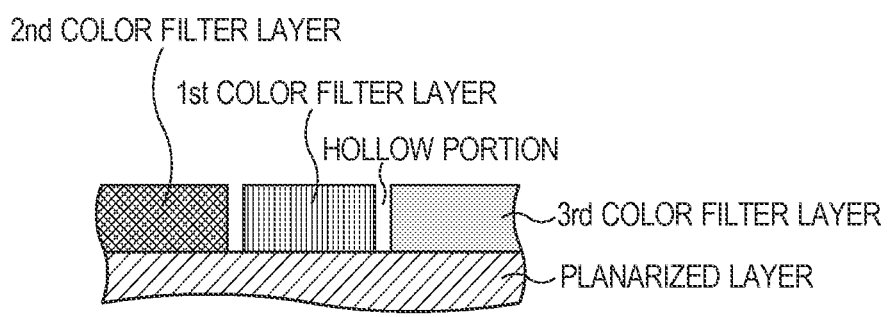

In the example illustrated in FIG. 8, the second and third color filters may be formed to cover the upper surfaces of the sacrificial layer when the second and third color filters are miss-aligned in a step illustrated in FIG. 6C. The sacrificial layer may not be exposed by an etching process in such a case. The sacrificial layer may not be removed, and the hollow portions may not be formed.

First Embodiment

A first embodiment of the present invention will be described.

FIGS. 1A to 1F are schematic views illustrating an example of a manufacturing method of a solid-state imaging apparatus (solid-state imaging device) according to a first embodiment of the present invention.

Figure 1A:
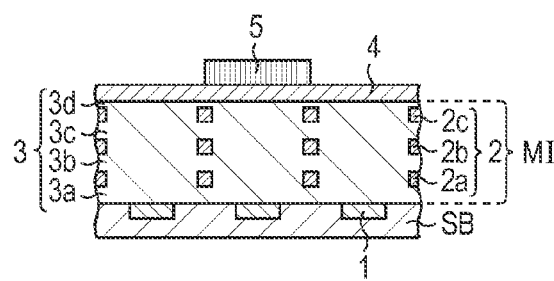
FIGS. 1A, 1B, 1C, 1D, 1E and 1F are schematic views illustrating an example of a manufacturing method of a solid-state imaging apparatus (solid-state imaging device) according to a first embodiment of the present invention.

FIG. 1A will be described.

A plurality of light receiving portions 1 is formed on a surface (upper surface) of a semiconductor substrate SB, in a two-dimensional matrix for example. The semiconductor substrate SB is, for example, a silicon substrate, and the light receiving portions 1 are, for example, photoelectric conversion elements (photodiodes).

A multilayered wiring structure MI is formed on the upper surface of the semiconductor substrate SB. The multilayered wiring structure MI is created by, for example, sequentially forming a first interlayer insulation layer 3a, a first wiring layer 2a, a second interlayer insulation layer 3b, a second wiring layer 2b, a third interlayer insulation layer 3c, a third wiring layer 2c and a fourth interlayer insulation layer 3d on the upper surface of the semiconductor substrate SB. Although the upper surface of the fourth interlayer insulation layer 3d is planarized in the example illustrated in FIG. 1A, the upper surface may not be planarized. Therefore, the upper surface of the fourth interlayer insulation layer 3d may be uneven. The first to fourth interlayer insulation layers 3a to 3d will be collectively called "interlayer insulation layers 3", and the first to third wiring layers 2a to 2c will be collectively called "wiring layers 2". The wiring layers 2 may be formed by so-called damascene (method of forming grooves on the undercoat interlayer insulation layers 3 and embedding metal layers as the wiring layers 2 in the grooves) or by so-called etching (method of forming metal layers on the undercoat interlayer insulation layers 3 and forming a pattern by etching the metal layers). The interlayer insulation layers 3 are formed by, for example, an inorganic material such as silicon oxide, silicon nitride and silicon oxynitride. In the present embodiment, the interlayer insulation layers 3 are formed by silicon oxide.

A first planarized layer 4 is formed on the multi-layer wiring structure MI. The first planarized layer 4 is formed by, for example, an organic material such as acrylic resin.

Photolithography is used to form a first color filter 5 on the upper surface of the first planarized layer 4, in an area above the light receiving portion 1 positioned at the center in FIG. 1A. The first color filter 5 is, for example a green (G) filter and is formed by, for example, an organic material of acrylic resin.

Figure 1D:
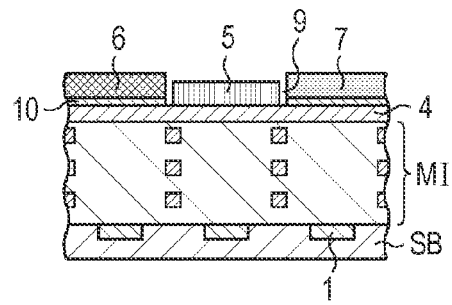
Figure 1B:
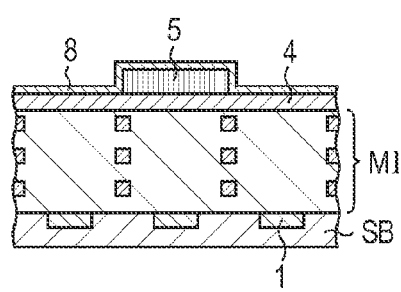

As illustrated in FIG. 1B, a thin sacrificial layer 8 is formed on the entire surface including upper and side surfaces of the first color filter 5. The sacrificial layer 8 is a layer for forming hollow portions (air gaps) between the color filters. A material with an etching rate different from that of the material of the color filters, such as an inorganic material of silicon oxide ($SiO_2$) or silicon nitride (SiN), is used for the sacrificial layer 8. In the present example, a layer made of a silicon oxide film is applied as the sacrificial layer 8. The deposition temperature can be 250° C. or less, and the film thickness can be 200 nm or less. In the present embodiment, the deposition temperature is 200° C., and the film thickness is a thickness that increases a reflectance of the first color filter 5.

Figure 1E:
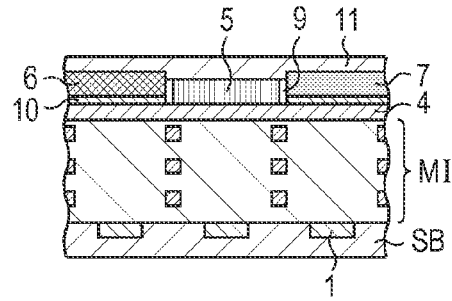
Figure 1C:
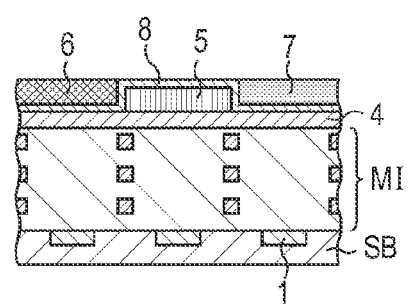

As illustrated in FIG. 1C, photolithography is used to form a second color filter 6 on the upper surface of the sacrificial layer 8, in an area above the light receiving portion 1 positioned on the left side of FIG. 1C. More specifically, the second color filter 6 is formed in a first direction from the first color filter 5, adjacent to the first color filter 5. The second color filter 6 is, for example, a red (R) filter. As illustrated in FIG. 1C, photolithography is used to form a third color filter 7 on the upper surface of the sacrificial layer 8, in an area above the light receiving portion 1 positioned on the right side of FIG. 1C. More specifically, the third color filter 7 is formed in a second direction from the first color filter 5, adjacent to the first color filter 5. The third color filter 7 is, for example, a blue (B) filter. The second and third color filters 6 and 7 are formed by, for example, an organic material of acrylic resin.

In the example illustrated in FIGS. 1A to 1F, the second and third color filters 6 and 7 do not cover the side and upper surface areas of the first color filter 5 on the sacrificial layer 8. However, the present embodiment is not limited to this format. For example, the second and third color filters 6 and 7 may be formed to cover the side surface areas of the first color filter 5 on the sacrificial layer 8 or may be formed to cover the side surface areas and part of the upper surface area of the first color filter 5 on the sacrificial layer 8. Therefore, the second and third color filters 6 and 7 can be formed to expose at least part of the upper surface area of the first color filter 5 on the sacrificial layer 8.

In the example illustrated in FIGS. 1A to 1F, the height of the upper surfaces of the second and third color filters 6 and 7 is substantially the same as the height of the upper surface of the sacrificial layer 8 formed on the upper surface of the first color filter 5. Therefore, the color filters 5 to 7 have substantially the same film thickness in the example illustrated in FIGS. 1A to 1F. However, the present embodiment is not limited to this format. The second and third color filters 6 and 7 may have thicknesses different from the thickness of the first color filter 5 as necessary.

Although the color filters are so-called primary color (RGB) filters in the description of the present example, the present embodiment is not limited to this format, and the color filters may be so-called complementary color filters, for example. The arrangement of the color filters is not limited to the format illustrated in FIGS. 1A to 1F, and for example, a Bayer arrangement may be adopted.

As illustrated in FIG. 1D, the sacrificial layer 8 formed on the upper and side surfaces of the first color filter 5 is removed by, for example, wet etching to form hollow portions (air gaps) 9 between the color filters 5 to 7. In this case, sacrificial remaining film layers 10 remain between the second color filter 6 and the first planarized layer 4 and between the third color filter 7 and the first planarized layer 4. In the present embodiment, the sacrificial remaining film layers 10 with a thickness that increases the reflectance of the first color filter 5 are arranged in areas below the second and third color filters 6 and 7. This can reduce mixed colors generated when the light entered from the first color filter 5 enters the pixels of the second and third color filters 6 and 7. Although the wet etching is applied to etch the sacrificial layer 8 in the present example, dry etching may be used.

As illustrated in FIG. 1E, a second planarized layer 11 is formed on the entire surface including the upper surfaces of the color filters 5 to 7. The second planarized layer 11 functions as a sealing layer for sealing aperture regions of the hollow portions 9. An inorganic material, such as silicon oxide and silicon nitride, or an organic material, such as an acrylic resin, can be used for the second planarized layer 11. In the present embodiment, the second planarized layer 11 is formed by an organic material.

Figure 1F:
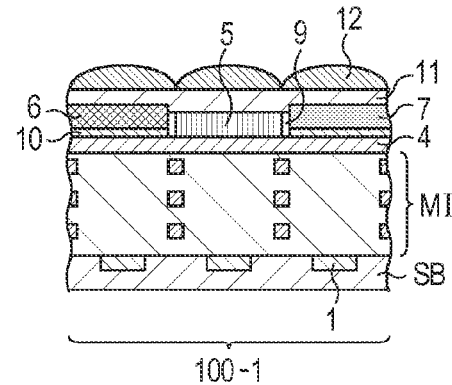

As illustrated in FIG. 1F, micro lenses 12 are formed on the upper surface of the second planarized layer 11, in areas above the light receiving portions 1. The micro lenses 12 are formed by, for example, an organic material of acrylic resin.

A solid-state imaging apparatus (solid-state imaging device) 100-1 including a plurality of pixels having the light receiving portions 1, the pixels arranged for example in a two-dimensional matrix, is created through the steps of FIGS. 1A to 1F. Although the photolithography is used to form the color filters 5 to 7 in the present embodiment, the present invention is not limited to this format.

In the first embodiment, the first color filter 5 as a predetermined color filter is formed above the semiconductor substrate SB, in an area above a predetermined light receiving portion (light receiving portion 1 positioned at the center in the example illustrated in FIGS. 1A to 1F) among the plurality of light receiving portions 1. The sacrificial layer 8 is formed on the upper and side surfaces of the first color filter 5 and on the upper surface of the planarized layer 4. The second and third color filters 6 and 7 as other color filters are formed in areas above the other light receiving portions (light receiving portions 1 positioned on the left and right sides in the example illustrated in FIGS. 1A to 1F) adjacent to the predetermined light receiving portion, to expose at least part of the upper surface area of the first color filter 5 on the sacrificial layer 8. The sacrificial layer 8 is etched under a condition such that at least part of the upper surface area of the first color filter 5 on the sacrificial layer 8 is exposed. The portions formed on the upper and side surfaces of the first color filter 5 on the sacrificial layer 8 are removed, and the portions on the lower surfaces of the second and third color filters 6 and 7 are left. In this way, the hollow portions 9 are formed between the first color filter 5 and the second color filter 6 and between the first color filter 5 and the third color filter 7.

According to the configuration, the second and third color filters 6 and 7 (other color filters) are formed under a condition such that the sacrificial layer 8 is formed not only on the side surfaces of the first color filter 5 (predetermined color filter), but also on the upper surface of the first color filter 5. Therefore, at least part of the upper surface area of the first color filter 5 on the sacrificial layer 8 can be exposed even if the second and third color filters 6 and 7 are miss-aligned. As a result, the sacrificial layer 8 can be surely etched, and the portions formed on the upper and side surfaces of the first color filter 5 on the sacrificial layer 8 can be removed to form the hollow portions 9 between the first color filter 5 and the second color filter 6 and between the first color filter 5 and the third color filter 7. This allows more stable formation of the hollow portions 9 between the color filters 5 to 7.

In the present embodiment, the photolithography is used to form the second and third color filters 6 and 7 as other color filters. In this case, the sacrificial layer 8 covers the side and upper surfaces of the first color filter 5. Therefore, the sacrificial layer 8 can be removed even if the second and third color filters 6 and 7 are formed to cover the side surface areas of the first color filter 5 on the sacrificial layer 8. As a result, the second and third color filters 6 and 7 can be formed regardless of the height of the side surface areas of the first color filter 5 on the sacrificial layer 8. Therefore, the thickness of the second and third color filters 6 and 7 can be increased or decreased relative to the first color filter 5. In this way, the film thickness of the second and third color filters 6 and 7 can be adjusted, and the degree of freedom of spectral adjustment can be improved.

In the present invention, the second and third color filters 6 and 7 as other color filters can be formed by etching back the entire surface, for example. In this case, the sacrificial layer 8 covers the side and upper surfaces of the first color filter 5, and the sacrificial layer 8 functions as an etching stopper layer. Therefore, the second and the third color filters 6 and 7 can be thinner than the first color filter 5. In this way, the film thickness of the second and third color filters 6 and 7 can be adjusted, and the degree of freedom of spectral adjustment can be improved.

Any format can be applied in the present embodiment as long as at least part of the upper surface area of the first color filter 5 on the sacrificial layer 8 is exposed when the second and third color filters 6 and 7 are formed. For example, the sacrificial layer 8 may be formed on part of the upper surface area of the first color filter 5 as long as at least part of the upper surface area of the first color filter 5 on the sacrificial layer 8 is exposed when the second and third color filters 6 and 7 are formed.

In the present embodiment, a passivation layer may be arranged between the interlayer insulation layer 3 (fourth interlayer insulation layer 3d) and the first planarized layer 4.

Second Embodiment

A second embodiment of the present invention will be described.

FIGS. 2A to 2F are schematic views illustrating an example of a manufacturing method of a solid-state imaging apparatus (solid-state imaging device) according to the second embodiment of the present invention. In FIGS. 2A to 2F, the same configurations as the configurations illustrated in FIGS. 1A to 1F are designated with the same reference numerals.

Figure 2A:
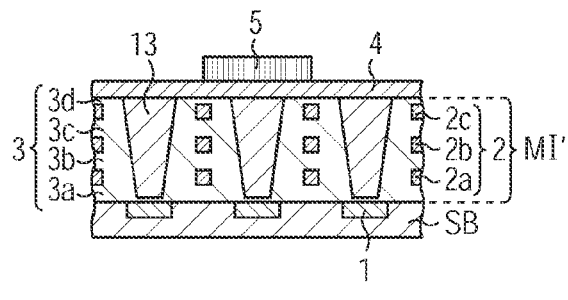
FIGS. 2A, 2B, 2C, 2D, 2E and 2F are schematic views illustrating an example of a manufacturing method of a solid-state imaging apparatus (solid-state imaging device) according to a second embodiment of the present invention.

FIG. 2A will be described.

In FIG. 2A, the configuration of the semiconductor substrate SB and below is the same as that of FIG. 1A in the first embodiment, and the description will not be repeated.

After the plurality of light receiving portions 1 are formed on the surface (upper surface) of the semiconductor substrate SB, a multilayered wiring structure MI' is formed on the upper surface of the semiconductor substrate SB as illustrated in FIG. 2A. In addition to the multilayered wiring structure MI illustrated in FIG. 1A, the multilayered wiring structure MI' illustrated in FIG. 2A includes waveguides (optical waveguides) 13 formed corresponding to the light receiving portions 1 in the interlayer insulation layers 3, above the light receiving portions 1. The waveguides 13 are formed by, for example, silicon nitride. Although the interlayer insulation layer 3 (first interlayer insulation layer 3a) exists between the light receiving portions 1 and the waveguides 13 in the example illustrated in FIGS. 2A to 2F, the present embodiment is not limited to this format. For example, waveguides 13 penetrating through the interlayer insulation layers 3 to contact with the light receiving portions 1 may be arranged in the interlayer insulation layers 3. In this way, the arrangement of the waveguides 13 can improve the light collecting efficiency of the light receiving portions 1.

The first planarized layer 4 is formed on the multilayered wiring structure MI' (on the upper surfaces of the interlayer insulation layers 3 and the waveguides 13).

Photolithography is used to form the first color filter 5 on the upper surface of the first planarized layer 4, in the area above the light receiving portion 1 positioned at the center of FIG. 2A.

A solid-state imaging apparatus (solid-state imaging device) 100-2 including a plurality of pixels having the light receiving portions 1, the pixels arranged for example in a two-dimensional matrix, is created through the steps of FIGS. 2B to 2F corresponding to FIGS. 1B to 1F in the first embodiment.

Figure 2D:
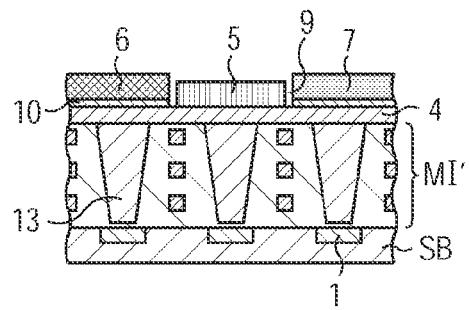
Figure 2B:
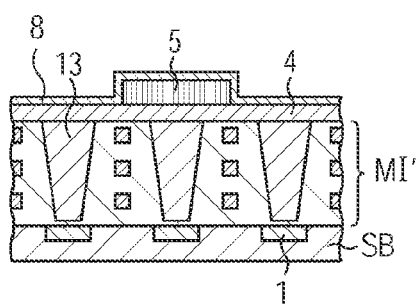
Figure 2E:
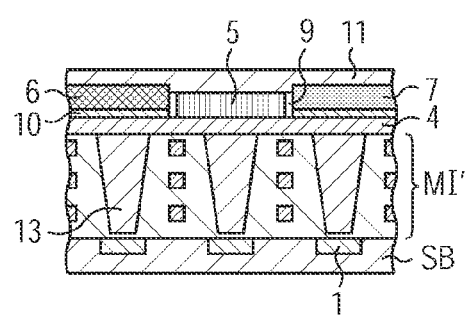
Figure 2C:
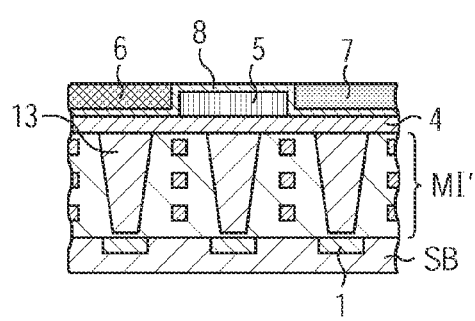
Figure 2F:
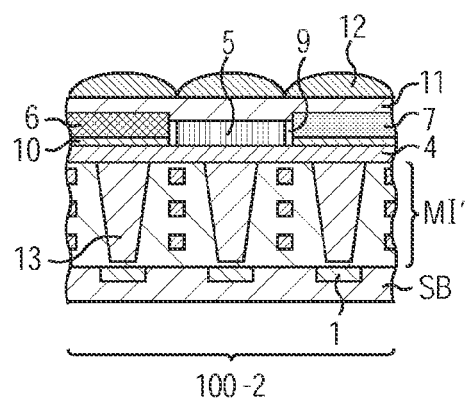

According to the second embodiment, the steps of FIGS. 2C and 2D corresponding to FIGS. 1C and 1D of the first embodiment are executed, and the same effects as in the first embodiment can be attained. More specifically, more stable formation of the hollow portions 9 between the color filters 5 to 7 is possible.

Third Embodiment

A third embodiment of the present invention will be described.

FIGS. 3A to 3F are schematic views illustrating an example of a manufacturing method of a solid-state imaging apparatus (solid-state imaging device) according to the third embodiment of the present invention. In FIGS. 3A to 3F, the same configurations as the configurations illustrated in FIGS. 1A to 1F are designated with the same reference numerals.

Figure 3A:
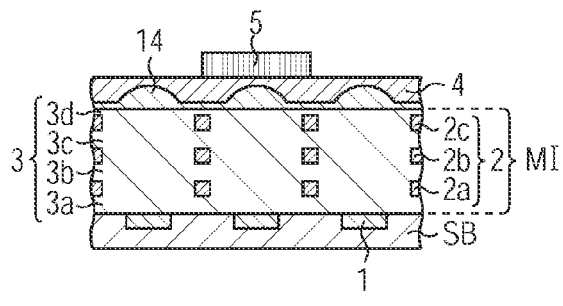
FIGS. 3A, 3B, 3C, 3D, 3E and 3F are schematic views illustrating an example of a manufacturing method of a solid-state imaging apparatus (solid-state imaging device) according to a third embodiment of the present invention.

FIG. 3A will be described.

In FIG. 3A, the configuration of the multilayered wiring structure MI and below is the same as that of FIG. 1A in the first embodiment, and the description will not be repeated.

After the multilayered wiring structure MI is formed, inner lenses (lenses in layer) 14 are formed on the multilayered wiring structure MI (upper surface of the interlayer insulation layers 3), in areas above the light receiving portions 1, as illustrated in FIG. 3A. The inner lenses 14 are formed by, for example, silicon nitride. As a result of the arrangement of the inner lenses 14, the light collecting efficiency of the light receiving portions 1 can be improved by combining the inner lenses 14 and the micro lenses 12 formed above the inner lenses 14.

The first planarized layer 4 is formed on the inner lenses 14.

Photolithography is used to form the first color filter 5 on the upper surface of the first planarized layer 4, in the area above the light receiving portion 1 positioned at the center of FIG. 3A.

A solid-state imaging apparatus (solid-state imaging device) 100-3 including a plurality of pixels having the light receiving portions 1, the pixels arranged for example in a two-dimensional matrix, is created through the steps of FIGS. 3B to 3F corresponding to FIGS. 1B to 1F in the first embodiment.

Figure 3D:
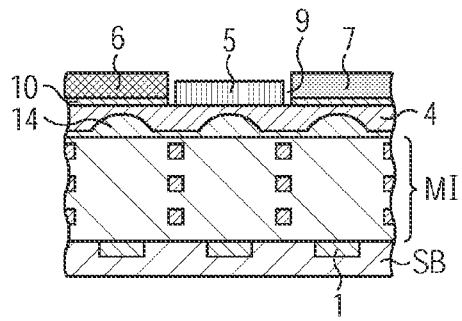
Figure 3B:
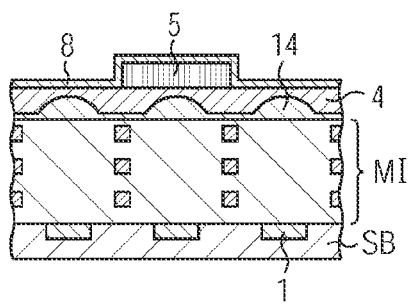
Figure 3E:
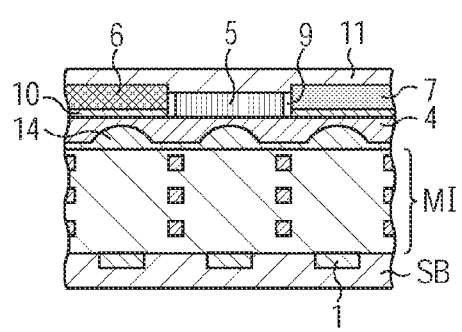
Figure 3C:
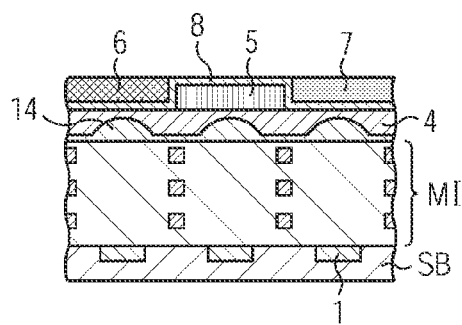
Figure 3F:
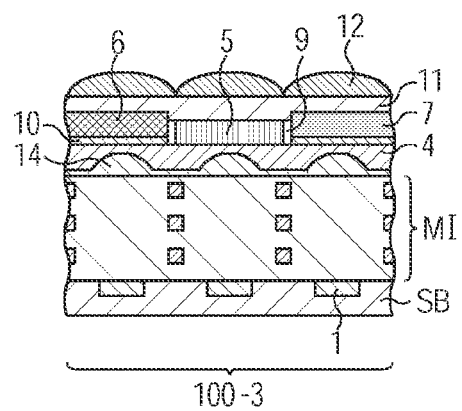

According to the third embodiment, the steps of FIGS. 3C and 3D corresponding to FIGS. 1C and 1D in the first embodiment are executed, and the same effects as in the first embodiment can be attained. More specifically, more stable formation of the hollow portions 9 between the color filters 5 to 7 is possible.

Fourth Embodiment

A fourth embodiment of the present invention will be described.

FIGS. 4A to 4H are schematic views illustrating an example of a manufacturing method of a solid-state imaging apparatus (solid-state imaging device) according to the fourth embodiment of the present invention. In FIGS. 4A to 4H, the same configurations as the configurations illustrated in FIGS. 1A to 1F are designated with the same reference numerals.

Figure 4A:
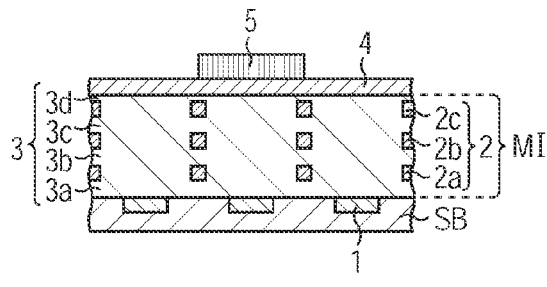
FIGS. 4A, 4B, 4C, 4D, 4E, 4F, 4G and 4H are schematic views illustrating an example of a manufacturing method of a solid-state imaging apparatus (solid-state imaging device) according to a fourth embodiment of the present invention.
Figure 4E:
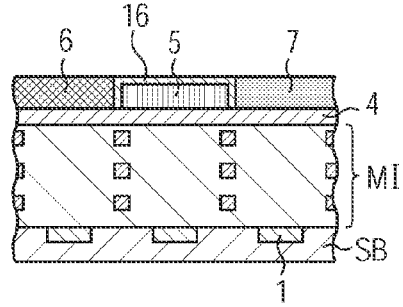
Figure 4B:
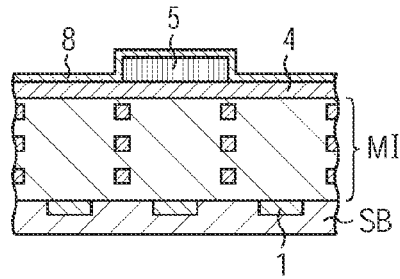

In the present embodiment, the steps of FIGS. 4A and 4B corresponding to FIGS. 1A and 1B in the first embodiment are executed. The thin sacrificial layer 8 is formed on the entire surface including the upper and side surfaces of the first color filter 5 through the steps of FIGS. 4A and 4B. In the present example, a layer made of a silicon oxide film is applied as the sacrificial layer 8. The deposition temperature can be 250° C. or less, and the film thickness can be 200 nm or less. In the present embodiment, the deposition temperature is 200° C., and the film thickness is 94 nm.

Figure 4F:
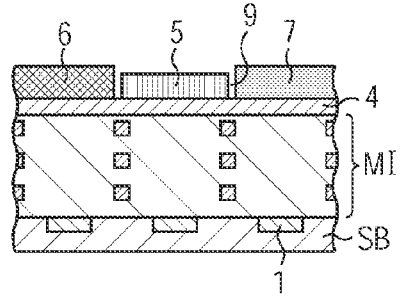
Figure 4C:
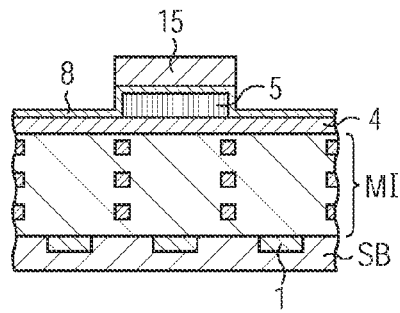

As illustrated in FIG. 4C, a photoresist 15 is formed on the sacrificial layer 8 deposited on the upper and side surfaces of the first color filter 5.

Figure 4G:
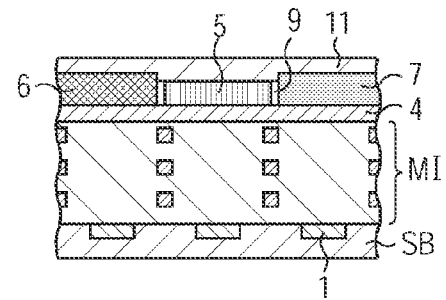
Figure 4D:
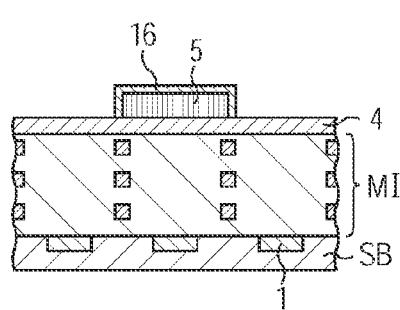

As illustrated in FIG. 4D, the sacrificial layer 8 in the areas other than the areas of the upper and side surfaces of the first color filter 5 is removed by etching using the photoresist 15 as a mask. As a result, a sacrificial layer 16 remains on the upper and side surfaces of the first color filter 5. The photoresist 15 is removed by asking.

As illustrated in FIG. 4E, photolithography is used to form the second color filter 6 on the upper surface of the first planarized layer 4, in the area above the light receiving portion 1 positioned on the left side of FIG. 4E. As illustrated in FIG. 4E, photolithography is used to form the third color filter 7 on the upper surface of the first planarized layer 4, in the area above the light receiving portion 1 positioned on the right side of FIG. 4E. In the example illustrated in FIGS. 4A to 4H, the height of the upper surfaces of the second and third color filters 6 and 7 is substantially the same as the height of the upper surface of the sacrificial layer 16. More specifically, the thickness of the second and third color filters 6 and 7 is different from the thickness of the first color filter 5 in the example illustrated in FIGS. 4A to 4H (specifically, the thickness of the second and third color filters 6 and 7 is greater than the thickness of the first color filter 5). The arrangement of the color filters is not limited to the format illustrated in FIGS. 4A to 4H, and for example, an arrangement such as a Bayer arrangement may be adopted.

Although the second and third color filters 6 and 7 do not cover the side and upper surface areas of the first color filter 5 on the sacrificial layer 16 in the example illustrated in FIGS. 4A to 4H, the present embodiment is not limited to this format. For example, the second and third color filters 6 and 7 may be formed to cover the side surface areas of the first color filter 5 on the sacrificial layer 16 or may be formed to cover the side surface areas and part of the upper surface area of the first color filter 5 on the sacrificial layer 16. More specifically, the second and third color filters 6 and 7 can be formed to expose at least part of the upper surface area of the first color filter 5 on the sacrificial layer 16.

As illustrated in FIG. 4F, the sacrificial layer 16 formed on the upper and side surfaces of the first color filter 5 is removed by, for example, wet etching to form the hollow portions 9 between the color filters 5 to 7. Although the wet etching is applied to etch the sacrificial layer 16 in the present example, dry etching may be used.

As illustrated in FIG. 4G, the second planarized layer 11 is formed on the entire surface including the upper surfaces of the color filters 5 to 7. The second planarized layer 11 functions as a sealing layer for sealing the aperture regions of the hollow portions 9. An inorganic material, such as silicon oxide and silicon nitride, or an organic material, such as acrylic resin, can be used for the second planarized layer 11. In the present embodiment, the second planarized layer 11 is formed by an organic material.

Figure 4H:
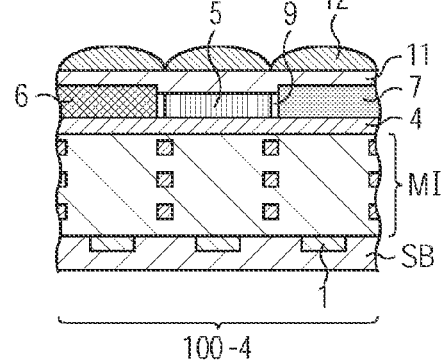

As in FIG. 1F of the first embodiment, the micro lenses 12 are formed on the upper surface of the second planarized layer 11, in the areas above the light receiving portions 1, as illustrated in FIG. 4H.

A solid-state imaging apparatus (solid-state imaging device) 100-4 including a plurality of pixels having the light receiving portions 1, the pixels arranged for example in a two-dimensional matrix, is created through the steps of FIGS. 4A to 4H. Although the photolithography is used to form the color filters 5 to 7 in the present embodiment, the present invention is not limited to this format.

In the fourth embodiment, the first color filter as a predetermined color filter is formed above the semiconductor substrate SB, in an area above a predetermined light receiving portion (light receiving portion 1 positioned at the center in the example illustrated in FIGS. 1A to 1F) among the plurality of light receiving portions 1. The sacrificial layer 16 is formed on the upper and side surfaces of the first color filter 5. The second and third color filters 6 and 7 as other color filters are formed in areas above the other light receiving portions (light receiving portions 1 positioned on the left and right sides in the example illustrated in FIGS. 1A to 1F) adjacent to the predetermined light receiving portion, to expose at least part of the upper surface area of the first color filter 5 on the sacrificial layer 16. The sacrificial layer 16 is etched under a condition such that at least part of the upper surface area of the first color filter 5 on the sacrificial layer 16 is exposed, and the sacrificial layer 16 is removed to form the hollow portions 9 between the first color filter 5 and the second color filter 6 and between the first color filter 5 and the third color filter 7.

According to the configuration, the second and third color filters 6 and 7 (other color filters) are formed under a condition such that the sacrificial layer 16 is formed not only on the side surfaces of the first color filter 5 (predetermined color filter), but also on the upper surface of the first color filter 5. Therefore, at least part of the upper surface area of the first color filter 5 on the sacrificial layer 16 can be exposed even if the second and third color filters 6 and 7 are miss-aligned. As a result, the sacrificial layer 16 can be surely etched, and the sacrificial layer 16 can be removed to form the hollow portions 9 between the first color filter 5 and the second color filter 6 and between the first color filter 5 and the third color filter 7. This allows more stable formation of the hollow portions 9 between the color filters 5 to 7.

Fifth Embodiment

A fifth embodiment of the present invention will be described.

FIGS. 5A to 5F are schematic views illustrating an example of a manufacturing method of a solid-state imaging apparatus (solid-state imaging device) according to the fifth embodiment of the present invention. In FIGS. 5A to 5F, the same configurations as the configurations illustrated in FIGS. 1A to 3F are designated with the same reference numerals.

Figure 5A:
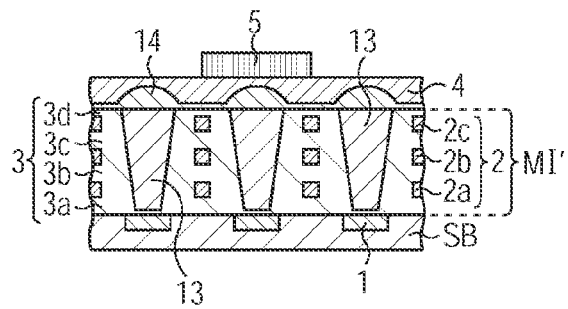
FIGS. 5A, 5B, 5C, 5D, 5E and 5F are schematic views illustrating an example of a manufacturing method of a solid-state imaging apparatus (solid-state imaging device) according to a fifth embodiment of the present invention.

FIG. 5A will be described.

In FIG. 5A, the configurations of the multilayered wiring structure MI' and below are the same as in FIG. 2A in the second embodiment, and the description will not be repeated.

After the multilayered wiring structure MI' is formed, the inner lenses (lenses in layer) 14 are formed on the multilayered wiring structure MI' (on the upper surfaces of the interlayer insulation layers 3 and the waveguides 13), in the areas above the light receiving portions 1, as illustrated in FIG. 5A. As a result of the arrangement of the inner lenses 14, the light collecting efficiency of the light receiving portions 1 can be improved by combining the inner lenses 14 and the micro lenses 12 formed over the inner lenses 14.

The first planarized layer 4 is formed on the inner lenses 14. Photolithography is used to form the first color filter 5 on the upper surface of the first planarized layer 4, in the area above the light receiving portion 1 positioned at the center of FIG. 3A.

A solid-state imaging apparatus (solid-state imaging device) 100-5 including a plurality of pixels having the light receiving portions 1, the pixels arranged for example in a two-dimensional matrix, is created through the steps of FIGS. 5B to 5F corresponding to FIGS. 1B to 1F in the first embodiment.

Figure 5D:
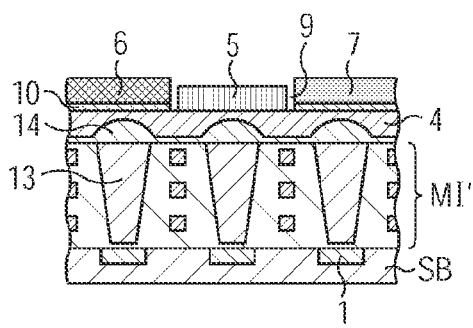
Figure 5B:
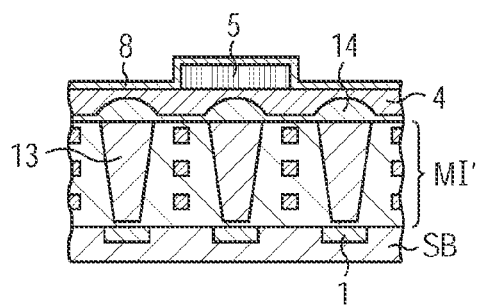
Figure 5E:
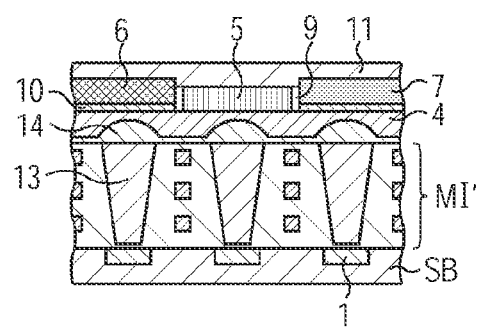
Figure 5C:
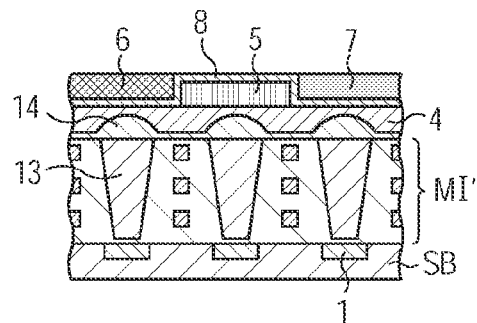
Figure 5F:
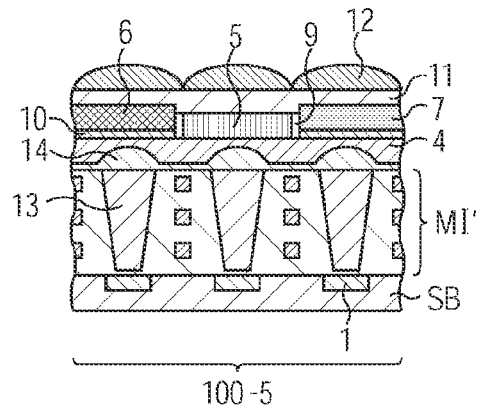

According to the fifth embodiment, the steps of FIGS. 5C and 5D corresponding to FIGS. 1C and 1D in the first embodiment are executed, and the same effects as in the first embodiment can be attained. More specifically, more stable formation of the hollow portions 9 between the color filters 5 to 7 is possible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-005613, filed Jan. 16, 2013, which is hereby incorporated by reference herein in its entirety.

What is claimed is:

1. A manufacturing method of a solid-state imaging apparatus comprising a semiconductor substrate having a plurality of light receiving portions provided thereon, the method comprising:
    forming a first color filter layer at a position corresponding to a first light receiving portion;
    forming a sacrificial layer on an upper surface and a side surface of the first color filter layer;
    forming a second color filter layer at a position corresponding to a second light receiving portion adjacent to the first light receiving portion without covering a part of the sacrificial layer on the upper surface of the first color filter layer; and
    removing the sacrificial layer on the upper surface and on the side surface of the first color filter layer in a same etching process so that a hollow portion is formed between the first color filter layer and the second color filter layer.

2. The manufacturing method according to claim 1, further comprising forming a sealing layer sealing an aperture region of the hollow portion, after forming the hollow portion.

3. The manufacturing method according to claim 1, wherein:
    in the forming the first color filter layer, the first color filter layer is formed on an upper surface of a planarized layer over the first receiving portion;
    in the forming the sacrificial layer, the sacrificial layer is formed on the upper surface and the side surface of the first color filter layer and on the upper surface of the planarized layer;
    in the forming the second color filter layer, the second color filter layer is formed on the sacrificial layer above the second light receiving portion; and
    in the forming the hollow portion, the sacrificial layer is etched so as to remove the sacrificial layer on the upper surface and on the side surface of the first color filter layer, and to in retain the sacrificial layer under the second color filter layer, to form the hollow portion between the first color filter layer and the second color filter layer.

4. The manufacturing method according to claim 1, wherein the first color filter layer and the second color filter layer have different thicknesses.

5. The manufacturing method according to claim 1, wherein the first color filter layer is a green filter.

6. The manufacturing method according to claim 1, wherein:
   the second color filter layer includes a red filter layer and a blue filter layer;
   the forming the second color filter layer includes forming the red filter layer adjacent to the first color filter layer in a first direction; and
   forming the blue filter layer adjacent to the first color filter layer in a second direction.

7. The manufacturing method according to claim 1, further comprising forming a micro lens layer above the first color filter layer and over the second color filter layer, and above each of the plurality of light receiving portions.

8. The manufacturing method according to claim 1, further comprising:
   forming an insulating layer over the semiconductor substrate; and
   forming a waveguide in the insulating layer above each of the plurality of light receiving portions.

9. The manufacturing method according to claim 1, further comprising forming an inner lens between the substrate and the first and the second color filter layers, above each of the plurality of light receiving portions.

* * * * *